(12) United States Patent
Bal et al.

(10) Patent No.: US 9,614,508 B1
(45) Date of Patent: Apr. 4, 2017

(54) SYSTEM AND METHOD FOR DESKEWING OUTPUT CLOCK SIGNALS

(71) Applicant: Integrated Device Technology, Inc., San Jose, CA (US)

(72) Inventors: Jagdeep Bal, Saratoga, CA (US); Louis F. Poitras, San Ramon, CA (US)

(73) Assignee: INTEGRATED DEVICE TECHNOLOGY, INC., San Jose, CA (US)

(*) Notice: Subject to any disclaimer, the term of this patent is extended or adjusted under 35 U.S.C. 154(b) by 0 days.

(21) Appl. No.: 14/958,701

(22) Filed: Dec. 3, 2015

(51) Int. Cl.
 *H03L 7/00* (2006.01)
 *H03K 5/14* (2014.01)
 *H03K 5/131* (2014.01)

(52) U.S. Cl.
 CPC .............. *H03K 5/14* (2013.01); *H03K 5/131* (2013.01)

(58) Field of Classification Search
 USPC ......................................... 327/161, 231, 261
 See application file for complete search history.

(56) References Cited

U.S. PATENT DOCUMENTS

| | | | |
|---|---|---|---|
| 4,862,485 A | 8/1989 | Guinea et al. | |
| 5,663,105 A | 9/1997 | Yu et al. | |
| 5,748,949 A | 5/1998 | Johnston et al. | |
| 5,757,240 A | 5/1998 | Boerstler et al. | |
| 5,903,195 A | 5/1999 | Lukes et al. | |
| 6,219,797 B1 | 4/2001 | Liu et al. | |
| 6,259,327 B1 | 7/2001 | Balistreri et al. | |
| 6,640,311 B1 | 10/2003 | Knowles et al. | |
| 6,643,787 B1* | 11/2003 | Zerbe ........................ | G06F 1/10 710/104 |
| 6,650,193 B2 | 11/2003 | Endo et al. | |
| 6,683,506 B2 | 1/2004 | Ye et al. | |
| 6,727,767 B2 | 4/2004 | Takada et al. | |
| 6,768,387 B1 | 7/2004 | Masuda et al. | |
| 6,959,066 B2 | 10/2005 | Wang et al. | |
| 7,012,476 B2 | 3/2006 | Ogiso et al. | |
| 7,323,916 B1 | 1/2008 | Sidiropoulos et al. | |
| 7,405,594 B1 | 7/2008 | Xu et al. | |
| 7,434,083 B1 | 10/2008 | Wilson et al. | |
| 7,541,848 B1 | 6/2009 | Masuda et al. | |
| 7,545,188 B1 | 6/2009 | Xu et al. | |
| 7,573,303 B1 | 8/2009 | Chi et al. | |
| 7,586,347 B1 | 9/2009 | Ren et al. | |
| 7,590,163 B1 | 9/2009 | Miller et al. | |

(Continued)

OTHER PUBLICATIONS

"19-Output PCIE Gen 3 Buffer", Si53019-A01A, Silicon Laboratories Inc., Rev. 1.1 May 2015, 34 Pages.

(Continued)

*Primary Examiner* — Adam Houston
(74) *Attorney, Agent, or Firm* — Glass & Associates; Kenneth Glass; Molly Sauter

(57) ABSTRACT

A clock generator having deskewed outputs signals wherein a transit time of each of a plurality of traces coupled to the clock generator outputs are determined and the longest trace is identified as the trace having the longest transit time. A time delay is then added to an output clock signal at each of the clock generator outputs that are not coupled to the longest trace. The addition of the time delay for each of the clock generator outputs is effective in automatically deskewing the clock generator outputs.

20 Claims, 6 Drawing Sheets

(56) References Cited

U.S. PATENT DOCUMENTS

| | | | |
|---|---|---|---|
| 7,671,635 B2 | 3/2010 | Fan et al. | |
| 7,737,739 B1 | 6/2010 | Bi et al. | |
| 7,741,981 B1 | 6/2010 | Wan et al. | |
| 7,750,618 B1 | 7/2010 | Fang et al. | |
| 7,786,763 B1 | 8/2010 | Bal et al. | |
| 7,816,959 B1 | 10/2010 | Isik et al. | |
| 7,907,625 B1 | 3/2011 | MacAdam et al. | |
| 7,928,880 B2 | 4/2011 | Tsukamoto | |
| 7,941,723 B1 | 5/2011 | Lien et al. | |
| 8,018,289 B1 | 9/2011 | Hu et al. | |
| 8,164,367 B1 | 4/2012 | Bal et al. | |
| 8,179,952 B2 | 5/2012 | Thurston et al. | |
| 8,188,796 B2 | 5/2012 | Zhu et al. | |
| 8,259,888 B2 | 9/2012 | Hua et al. | |
| 8,284,816 B1 | 10/2012 | Clementi et al. | |
| 8,305,154 B1 | 11/2012 | Kubena et al. | |
| 8,416,107 B1 | 4/2013 | Wan et al. | |
| 8,432,231 B2 | 4/2013 | Nelson et al. | |
| 8,436,677 B2 | 5/2013 | Kull et al. | |
| 8,456,155 B2 | 6/2013 | Tamura et al. | |
| 8,471,751 B2 | 6/2013 | Wang | |
| 8,537,952 B1 | 9/2013 | Arora et al. | |
| 8,693,557 B1 | 4/2014 | Zhang et al. | |
| 8,704,564 B2 | 4/2014 | Hasegawa et al. | |
| 8,723,573 B1 | 5/2014 | Wang et al. | |
| 8,791,763 B2 | 7/2014 | Taghivand | |
| 8,896,476 B2 | 11/2014 | Harpe | |
| 8,933,830 B1 | 1/2015 | Jeon | |
| 8,981,858 B1 | 3/2015 | Grivna et al. | |
| 9,077,386 B1* | 7/2015 | Holden | H04L 25/4925 |
| 9,100,232 B1* | 8/2015 | Hormati | H04L 25/03343 |
| 2002/0079937 A1 | 6/2002 | Xanthopoulos et al. | |
| 2002/0191727 A1 | 12/2002 | Staszewski et al. | |
| 2003/0042985 A1 | 3/2003 | Shibahara et al. | |
| 2003/0184350 A1 | 10/2003 | Wang et al. | |
| 2004/0136440 A1 | 7/2004 | Miyata et al. | |
| 2004/0165691 A1 | 8/2004 | Rana et al. | |
| 2006/0103436 A1 | 5/2006 | Saitou et al. | |
| 2006/0119402 A1 | 6/2006 | Thomsen et al. | |
| 2006/0197614 A1 | 9/2006 | Roubadia et al. | |
| 2006/0290391 A1 | 12/2006 | Leung et al. | |
| 2007/0149144 A1 | 6/2007 | Beyer et al. | |
| 2007/0247248 A1 | 10/2007 | Kobayashi et al. | |
| 2008/0043893 A1 | 2/2008 | Nagaraj et al. | |
| 2008/0104435 A1 | 5/2008 | Pernia et al. | |
| 2008/0129351 A1 | 6/2008 | Chawla et al. | |
| 2008/0246546 A1 | 10/2008 | Ha et al. | |
| 2009/0083567 A1 | 3/2009 | Kim et al. | |
| 2009/0140896 A1 | 6/2009 | Adduci et al. | |
| 2009/0184857 A1 | 7/2009 | Furuta et al. | |
| 2009/0231901 A1 | 9/2009 | Kim et al. | |
| 2009/0256601 A1 | 10/2009 | Zhang et al. | |
| 2009/0262567 A1 | 10/2009 | Shin et al. | |
| 2010/0007427 A1 | 1/2010 | Tomita et al. | |
| 2010/0052798 A1 | 3/2010 | Hirai et al. | |
| 2010/0090731 A1 | 4/2010 | Casagrande et al. | |
| 2010/0164761 A1 | 7/2010 | Wan et al. | |
| 2010/0194483 A1 | 8/2010 | Storaska et al. | |
| 2010/0323643 A1 | 12/2010 | Ridgers et al. | |
| 2011/0006936 A1 | 1/2011 | Lin et al. | |
| 2011/0032013 A1 | 2/2011 | Nelson et al. | |
| 2011/0234204 A1 | 9/2011 | Tamura et al. | |
| 2011/0234433 A1 | 9/2011 | Aruga et al. | |
| 2011/0285575 A1 | 11/2011 | Landez et al. | |
| 2011/0304490 A1 | 12/2011 | Janakiraman | |
| 2012/0013406 A1 | 1/2012 | Zhu et al. | |
| 2012/0161829 A1 | 6/2012 | Fernald et al. | |
| 2012/0200330 A1* | 8/2012 | Kawagoe | H03L 7/00 327/161 |
| 2012/0249207 A1 | 10/2012 | Natsume et al. | |
| 2012/0262315 A1 | 10/2012 | Kapusta et al. | |
| 2012/0297231 A1 | 11/2012 | Qawami et al. | |
| 2012/0317365 A1 | 12/2012 | Elhamias et al. | |
| 2012/0328052 A1 | 12/2012 | Etemadi et al. | |
| 2013/0002467 A1 | 1/2013 | Wang | |
| 2013/0162454 A1 | 6/2013 | Lin | |
| 2013/0194115 A1 | 8/2013 | Wu et al. | |
| 2013/0211758 A1 | 8/2013 | Prathapan et al. | |
| 2013/0300455 A1 | 11/2013 | Thirugnanam et al. | |
| 2014/0029646 A1 | 1/2014 | Foxcroft et al. | |
| 2014/0210532 A1 | 7/2014 | Jenkins et al. | |
| 2014/0327478 A1 | 11/2014 | Horng et al. | |
| 2014/0347941 A1 | 11/2014 | Jose et al. | |
| 2015/0162921 A1 | 6/2015 | Chen et al. | |
| 2015/0180594 A1 | 6/2015 | Chakraborty et al. | |
| 2015/0200649 A1 | 7/2015 | Trager et al. | |
| 2015/0213873 A1 | 7/2015 | Ihm et al. | |
| 2016/0084895 A1* | 3/2016 | Imhof | G01R 27/28 702/58 |
| 2016/0119118 A1* | 4/2016 | Shokrollahi | H04L 25/49 375/376 |
| 2016/0162426 A1* | 6/2016 | Benjamin | G06F 13/3625 710/118 |
| 2016/0211929 A1* | 7/2016 | Holden | H04B 3/02 375/224 |

OTHER PUBLICATIONS

"NB3W1200L: 3.3 V 100/133 MHz Differential 1:12 Push-Pull Clock ZDB/Fanout Buffer for PCIe", ON Semiconductor, http://onsemi.com, Aug. 2013, Rev. 0, 26 Pages.

Avramov, et al., "1.5-GHz Voltage Controlled Oscillator with 3% Tuning Bandwidth Using a Two-Pole DSBAR Filter", Ultrasonics, Ferroelectrics and Frequency Control. IEEE Transactions on. vol. 58., May 2011, pp. 916-923.

Hwang, et al., "A Digitally Controlled Phase-Locked Loop with a Digital Ohase-Frequency Detector for Fast Acquisition", IEEE Journal of Solid State Circuits, vol. 36, No. 10, Oct. 2001, pp. 1574-1581.

Kratyuk, et al., "Frequency Detector for Fast Frequency Lock of Digital PLLs", Electronic Letters, vol. 43, No. 1, Jan. 4, 2007, pp. 1-2.

Mansuri, "Fast Frequency Acquisition Phase-Frequency Detectors for GSamples/s Phase-Locked Loops", IEEE Journal of Solid-State Circuits, vol. 37 No. 10, Oct. 2002, pp. 1331-1334.

Nagaraju, "A Low Noise 1.5GHz VCO with a 3.75% Tuning Range Using Coupled FBAR's", IEEE International Ultrasonics Symposium (IUS), Oct. 2012, pp. 1-4.

Watanabe, "An All-Digital PLL for Frequency Multilication by 4 to 1022 with Seven-Cycle Lock Time", IEEE Journal of Solid-State Circuits, vol. 39 No. 2, Feb. 2003, pp. 198-204.

Texas Instruments "CDCEx913 Programmable 1-PLL VCXO Clock Synthesizer With 1.8-V, 2.5-V, and 3.3-V Outputs", Apr. 2015, pp. 1-36, pp. 11, 20-22.

* cited by examiner

SYSTEM AND METHOD FOR DESKEWING OUTPUT CLOCK SIGNALS

BACKGROUND OF THE INVENTION

The operation of modern electronic systems is synchronized by a periodic signal known as a clock signal that is provided by a clock generator to control the sequence and pacing of the devices of the electronic circuit. Programmable clock generators intended for high performance consumer, networking, industrial, computing and data communications applications are known in the art. Programmable clock generators may be programmed to generate a plurality of output clock signals from a single reference clock input.

The clock signals generated by the clock generator are provided to other devices within the system. The difference in the length of the conductive traces connecting the clock generator to the other devices results in the clock signal arriving at the various devices at different times. Undesirable clock skew results when the clock signal generated by the clock generator arrives at these devices at different times.

In order to accommodate for the difference in trace lengths, board designers utilizing clock generator chips are commonly required to add physical length to the shorter traces in their board designs to match the longest clock delay in the system or to add delay to the outputs of the clock generator driving shorter length traces. Requiring the board designer to make board level adjustments to accommodate for the clock skew of a clock generator unnecessarily complicates the use of a particular clock generator in a board level design.

Accordingly, what is needed in the art is a system and method for automatically detecting the trace lengths at each output of a clock generator and for adding an appropriate delay to each of the outputs to deskew the clock generator outputs.

SUMMARY

The invention describes a system and method by which the multiple outputs of a clock generator can be made to arrive at their destinations substantially simultaneously. The system and method of the present invention automatically detects the trace lengths at each output of a clock generator and adds an appropriate delay to each of the outputs to deskew the clock generator outputs, thereby eliminating the need for board level clock deskewing by the system board designer.

In one embodiment, a method for deskewing output clock signals includes, determining, at a clock generator, a transit time of each of a plurality of traces, each of the plurality of traces coupled between one of a plurality of clock generator outputs and one of a plurality of clock receivers. After the transit time of each of the traces as been determined, the method further includes, determining a longest transit time of the transit times of each of the plurality of traces and determining a difference between the longest transit time and the transit time of each of the plurality of traces to identify a time delay for each of the plurality of clock generator outputs. Following the determination of the time delay for each of the clock generator outputs, the method further includes, adding the time delay for each of the plurality of clock generator outputs to a output clock signal transmitted from each of the plurality of clock generator outputs. The addition of the appropriate time delay to each of the clock generator outputs is effective in automatically deskewing the clock generator outputs.

In an additional embodiment of the present invention, a circuit for deskewing output signals of a clock generator is provided which includes, a line length to digital converter circuit configured to determine a transit time of each of a plurality of traces coupled between one of a plurality of clock generator outputs of a clock generator and one of a plurality of clock receivers. The circuit further includes, a control circuit coupled to each of the line length to digital converter circuits. The control circuit is configured to determine a longest transit time of the transit times of each of the plurality of traces and to determine a difference between the longest transit time and the transit time of each of the plurality of traces to identifying a time delay for each of the plurality of clock generator outputs. To adjust the time delay of the clock generator outputs, the circuit further includes a digitally controlled delay element coupled to the control circuit and to the plurality of clock generator outputs. The digitally controlled delay element is configured to receive the time delay for each of the plurality of clock generator outputs and to add the time delay for each of the plurality of clock generator outputs to a output clock signal transmitted from each of the plurality of clock generator outputs, thereby deskewing the clock generator outputs.

Accordingly, the present invention provides a system and method for automatically detecting the trace lengths at each output of a clock generator and for adding an appropriate delay to each of the outputs to deskew the clock generator outputs

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DETAILED DESCRIPTION

The operation of modern electronic systems is synchronized by a periodic signal known as a clock signal that is provided by a clock generator to control the sequence and pacing of the devices of the electronic circuit. Programmable clock generators intended for high performance consumer, networking, industrial, computing and data communications applications are known in the art. The programmable clock generators may be programmed to generate a plurality of output clock signals from a single reference clock input. The present invention provides a system and method for deskewing the output signals of a clock generator.

Figure 1:
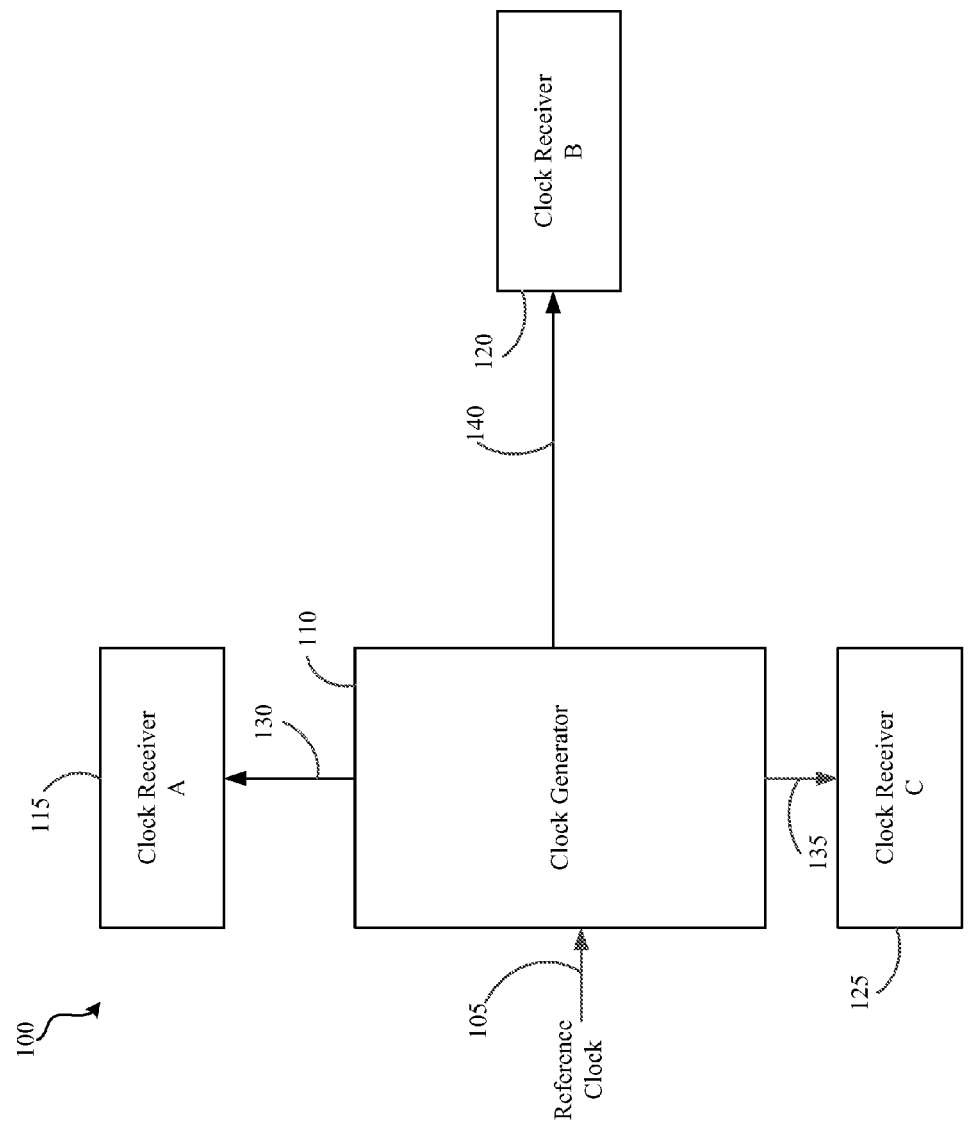
FIG. 1 is a block diagram of a system incorporating a clock generator, in accordance with an embodiment of the present invention.

With reference to FIG. 1, in a clock generator 110, independent output clock signals are generated from a reference clock 105 input signal to a clock generator 110. The clock output signals from the clock generator 110 may be different frequencies and voltage levels. In operation, the clock generator 110 provides clock output signals to other devices within the system through conductive traces within the board assembly. In the illustrated embodiment of a system 100 for generating a clock signal, the clock generator 110 provides an output signal to clock receiver A 115 through trace 130. The clock generator 110 additionally provides an output signal to clock receiver B 120 through trace 140 and an output signal to clock receiver C 125 through trace 135. In the present description, "clock receiver" is intended to refer to any of a variety of devices that are configured to receive a clocking signal output from the clock generator 110.

As shown in FIG. 1, the lengths of the conductive traces 130, 135, 140 extending between the clock generator 110 and the clock receivers 115, 120, 125 are different. A very common problem in modern electronic systems with high-speed clocking is clock skew between different elements, or devices, in the system. In the simplified diagram of FIG. 1, the output clock signals generated by the clock generator 110 will arrive at clock receivers A 115, B 120 and C 125 at different times, resulting in undesirable clock skew. The clock skew can result in logic errors when inter-chip communication occurs between the various system devices. In the system illustrated in FIG. 1, the clock generator outputs on the clock generator 110 that are coupled to clock receiver A 115 and clock receiver C 135 would need a compensating time delay added to their output paths because the traces 130, 135 connecting these clock receivers to the clock generator are shorter than the longest trace 140 coupling the clock generator to clock receiver B 120. To deskew the outputs of the clock generator 110, the present invention automatically detects the trace length at each output of the clock generator and adds a delay to the outputs that are driving shorter length traces.

Figure 2:
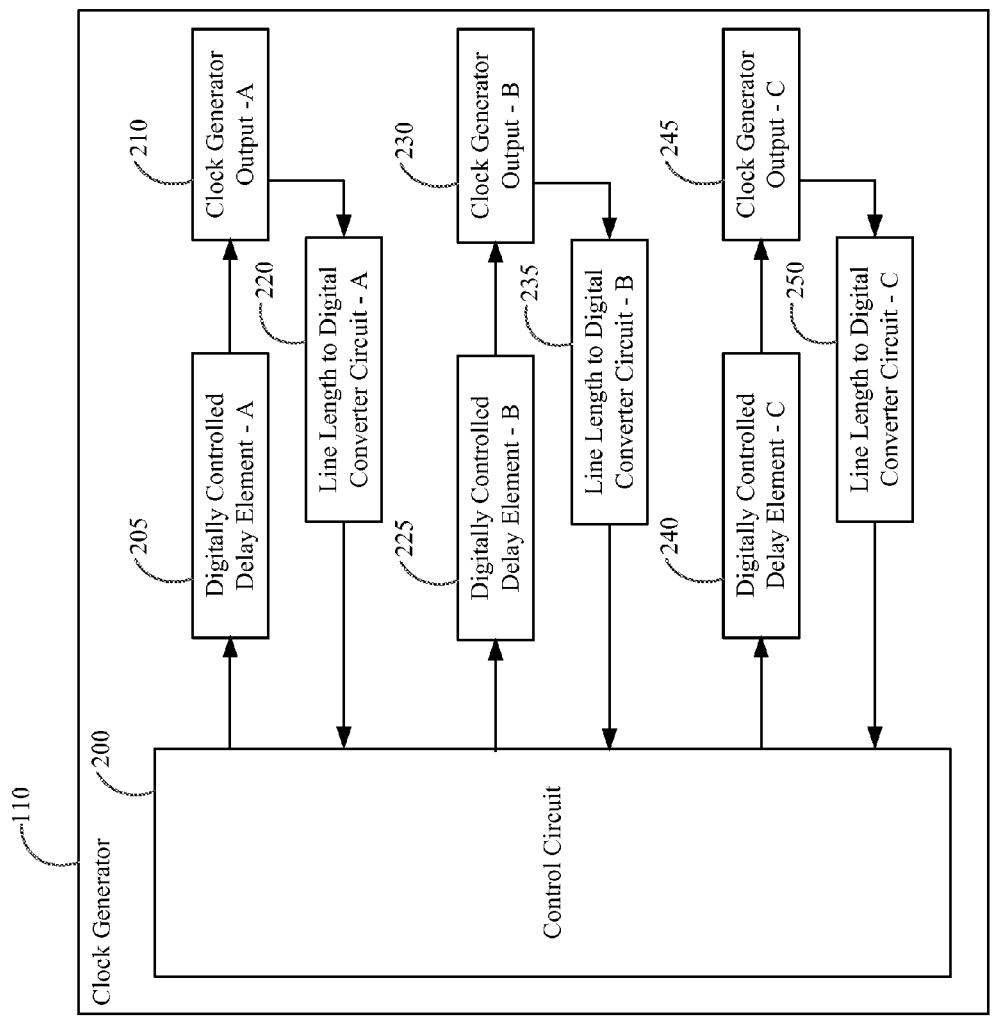
FIG. 2 is a block diagram illustrating a clock deskewing circuit of a clock generator for deskewing clock generator outputs, in accordance with an embodiment of the present invention.

With reference to FIG. 2, the clock generator 110 may include circuitry for deskewing the output signals of the clock generator 110. In this embodiment, the circuitry of the clock generator 110 includes control circuit 200, a plurality of digitally controlled delay elements 205, 225, 240 and a plurality of line length to digital converter circuits (LL2Ds) 220, 235, 250 coupled to a plurality of clock generator outputs 210, 230, 245 of the clock generator 110. In one embodiment, the digitally controlled delay elements are fractional output divider circuits (FODs), which are commonly used in clock generators for providing output clock signals of varying frequencies from a reference clock signal. Each of the line length to digital converter circuits 220, 235, 250 are coupled to one of the clock generator outputs 210, 230, 245 of the clock generator 110 and each of the digitally controlled delay elements 205, 225, 240 are coupled to the control circuit 200 and to one of the plurality of clock generator outputs 210, 230, 245. While the digitally controlled delay elements 205, 225, 240 and the line length to digital converter circuits (LL2Ds) 220, 235, 250 are illustrated as separate devices in FIG. 2, it is within the scope of the invention that the digitally controlled delay elements and the LL2Ds could be incorporated into one device having individual inputs and outputs to be coupled to the clock generators outputs 210, 230, 245.

In the present invention, each of the line length to digital converter circuits 220, 225, 240 are configured to determine a transit time of a trace coupled between the clock generator output and one of a plurality of clock receivers. In the present invention, the transit time of each of the plurality of traces is approximately equal to one half of a round-trip transit time of a signal transmitted on the trace between the clock generator output and a clock receiver. As such, referring to both FIG. 1 and FIG. 2, line length to digital converter circuit A 220 is coupled to clock generator output A 210 to determine a transit time of a trace 130 that is coupled between clock generator output A 210 and a clock receiver A 115. Additionally, line length to digital converter circuit B 235 is coupled to clock generator output B 230 to determine a transit time of a trace 140 that is coupled between clock generator output B 230 and a clock receiver B 120, and line length to digital converter circuit C 250 is coupled to clock generator output C 245 to determine a transit time of a trace 135 that is coupled between clock generator output C 245 and a clock receiver C 125.

The clock generator 110 further includes, a control circuit 200 coupled to each of the plurality of line length to digital converter circuits 220, 235, 250. The control circuit 200 is configured to determine the longest transit time of the transit times determined by each of the line length to digital converter circuits 220, 235, 250 and to determine a difference between the longest transit time and the transit time of each of the plurality of traces to identifying a time delay for each of the plurality of clock generator outputs 210, 230, 245. In general, the control circuit 200 receives the digital representation of the length of each trace from the plurality of line length to digital converter circuits 220, 235, 250 and performs the necessary calculations to determine which of the traces coupled to the clock generator outputs is the longest trace. The control circuit 200 also calculates a time delay for each of the clock generator outputs, wherein the time delay is dependent upon the difference between the longest trace length and the length of the trace being driven by each of the clock generator outputs. The time delay for each of the clock generator outputs 210, 230, 245 is substantially equal to the amount of delay that needs to be added to each individual clock generator outputs such that a clock signal sent on each of the individual clock generator outputs will arrive at a clock receiver at the same time as a clock signal simultaneously sent on the clock generator output coupled to the longest trace.

In an exemplary embodiment, with reference to FIG. 1 and FIG. 2, the control circuit 200 receives the digital representation of the length of the trace 130 coupled to clock generator output A 210 from line length to digital converter circuit A 220, the digital representation of the length of the trace 140 coupled to clock generator output B 230 from line length to digital converter circuit B 235 and the digital representation of the length of the trace 135 coupled to clock generator output C 245 from line length to digital converter circuit C 250. After receiving all of the line lengths from the line length to digital converter circuits 220, 235, 250, the control circuit 200 determines that the longest trace is the trace 140 coupled to clock generator output B 230. The control circuit 200 then calculates a time delay to be applied to an output signal from clock generator output A 210 and clock generator output C 245 which is based upon the difference between the length of the trace coupled to the specific clock generator output and the length of the longest trace coupled to the clock generator. In this particular embodiment, it can be seen that the trace 130 coupled to clock generator output A and the trace 135 coupled to clock generator output C are shorter than the trace 140 coupled to clock generator output B 230. As such, the control circuit will calculate a specific time delay for clock generator output A 210 and clock generator output C 245 and the time delay for clock generator output B 230 will be equal to zero and no time delay will be added to clock generator output B 230.

After an appropriate time delay has been calculated by the control circuit 200 for each of the clock generator outputs, the time delays are provided to the corresponding clock generator outputs by a digitally controlled delay element. The digitally controlled delay elements of the present invention are additionally programmed to delay the output clock signal at the clock generator outputs as determined by the time delays generated by the control circuit 200. In one embodiment, the clock generator 110 comprises, a plurality of digitally controlled delay elements 205, 225, 240, wherein each of the plurality of digitally controlled delay elements 205, 225, 240 are coupled to the control circuit 200 and to one of the plurality of clock generator outputs 210, 230, 245. Each of the digitally controlled delay elements 205, 225, 240 are configured to receive the time delay for the clock generator output that the digitally controlled delay element is coupled to from the control circuit 200 and to add the time delay for the clock generator output to an output clock signal transmitted from the clock generator output.

In the exemplary embodiment, with reference to FIG. 1 and FIG. 2, the time delay calculated by the control circuit 200 for clock generator output A 210 is provided to the digitally controlled delay element A 205 coupled to clock generator output A 210 and the digitally controlled delay element A 205 delays a clock signal from the clock generator output A 210 for a period of time equal to the time delay calculated for clock generator output A 210. Additionally, the time delay calculated by the control circuit 200 for clock generator output C 245 is provided to the digitally controlled delay element C 240 coupled to clock generator output C 245 and the digitally controlled delay element C 240 delays a clock signal from the clock generator output C 245 for a period of time equal to the time delay calculated for clock generator output C 245. In this embodiment, since the trace 140 coupled to clock generator output B 230 is the longest trace, the time delay generated by the control circuit 200 for clock generator output B is equal to zero. In one embodiment, the control circuit 200 may be configured to provide a time delay of zero to the digitally controlled delay element B 225, thereby essentially adding no time to clock generator output B 230. In an alternative embodiment, the control circuit 200 may be configured to not provide a time delay to the digitally controlled delay element coupled to the longest trace.

In general, in order to automatically determine the length of each of the traces coupled to each of the clock generator outputs, a clock signal is transmitted on each of the traces from the clock generator outputs to the associated clock receiver. The reflected clock signal reflected back to the clock generator output from the clock receiver, is then measured by the line length to digital converter circuits coupled to the clock generator output.

Figure 3A:
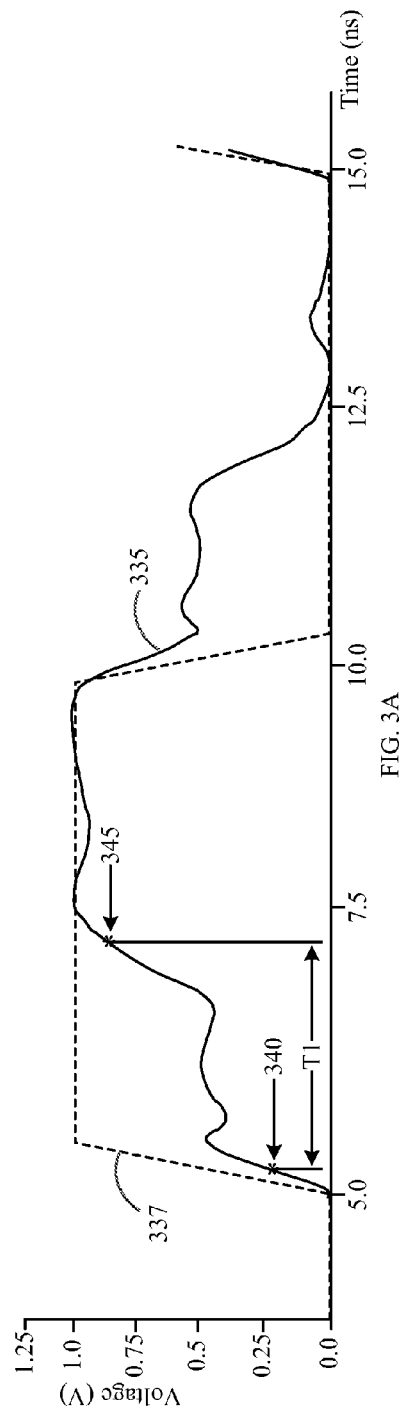
FIG. 3A is a diagram illustrating the clock signal and the reflected clock signal, in accordance with an embodiment of the present invention.
Figure 3B:
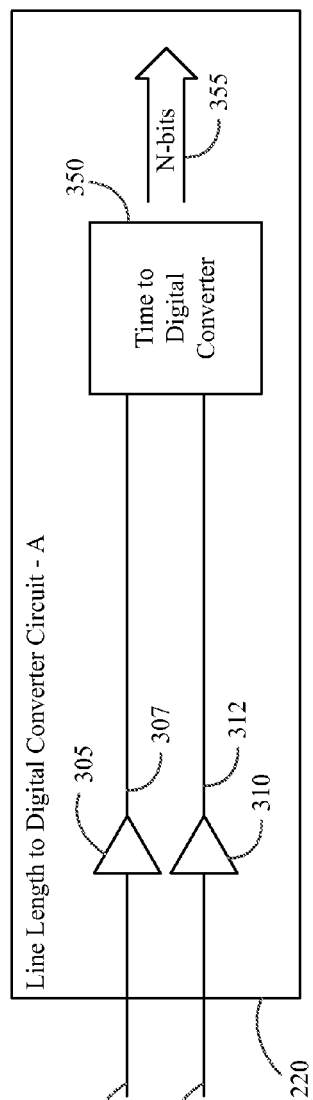
FIG. 3B is a diagram illustrating the line length to digital converters of the clock generator, in accordance with an embodiment of the present invention.
Figure 3C:
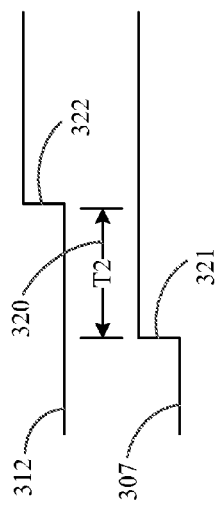
FIG. 3C is a diagram illustrating trigger voltages of the line length to digital converters of the clock generator, in accordance with an embodiment of the present invention.

In an exemplary embodiment shown with reference FIG. 3A, FIG. 3B and FIG. 3C, in order to automatically determine the length of the trace 130 between the clock generator 110 and the clock receiver A 115, a clock signal 337 is transmitted on the trace 130 between the clock generator 110 and clock receiver A 115. The clock signal 337 is reflected back by the clock receiver A 115 and the reflected signal 335 is received by a line length to digital converter circuit A 220 of the clock generator 110. The time required for the reflected signal 335 to be received at the line length to digital converter circuit A 220 is dependent upon the length of the conductive trace between the clock generator 110 and the clock receiver A 115. In general, the line length to digital converter circuit 220 is configured to measure a time required for a reflected signal on the clock generator output to reach a first voltage level, to measure a time required for the reflected signal 335 to reach a second voltage level and to calculate a difference between the time required for the reflected signal 335 to reach the first voltage level and the time required for the reflected signal to reach a second voltage level to determine a transit time for the trace 130 coupled to the clock generator output.

In one embodiment, the line length to digital converter circuit A 220 includes a first buffer 305 to receive the reflected signal 335 and a second buffer 310 to receive the reflected signal 335, wherein the threshold voltage of the first buffer 305 is lower than the threshold voltage of the second buffer 310. To measure the transit time for a trace coupled to a clock generator output, the first buffer 305, having a low threshold voltage, is used to measure the time required for a reflected signal 335 on a clock generator output to reach a first voltage level 340, wherein the first buffer 305 triggers when the clock output signal 335 reaches a first voltage level 340. The second buffer 310, having a high threshold voltage, is used to measure the time required for the reflected signal 335 on the same clock generator output to reach a second voltage level 345, wherein the second buffer 310 triggers when the clock output signal 335 reaches a second voltage level 345. The time difference (T1) between the time required for the reflected signal 335 to reach the first voltage level 340 and the time required for the reflected signal 335 to reach the second voltage level 345 is representative of the length of the conductive trace. In a specific embodiment, the first voltage level 340 may be equal to about 20% of a voltage of the transmitted clock signal and the second voltage level 345 may be equal to about 80% of a voltage of the transmitted clock signal.

As shown with reference to FIG. 3C, the relative length of the trace is then determined by measuring a time delay (T2) 320 between the rising edge 321 on the output 307 of the first buffer 305 and the rising edge 322 on the output 312 of the second buffer 310.

The line length to digital converter circuit A 220 may further include a time to digital converter 350 coupled to the outputs 307, 312 of the first buffer 305 and the second buffer 310 for converting the measured time delay to a digital representation of the trace length. The line length to digital converter circuit 300 may be configured to detect the rising edge 321 at an output 307 of the first buffer 305 to measure the time required for the reflected signal 335 to reach the first voltage level 340 and to detect a rising edge 322 at an output 312 of the second buffer 310 to measure the time required for the reflected signal 335 to reach the second voltage level 345. The time to digital converter 350 is further configured to convert the transit time 320, which is equal to the difference between the time required for the reflected signal to reach the first voltage level and the time required for the reflected signal to reach the second voltage level, to a digital transit time for the trace coupled to the clock generator output.

Figure 4A:
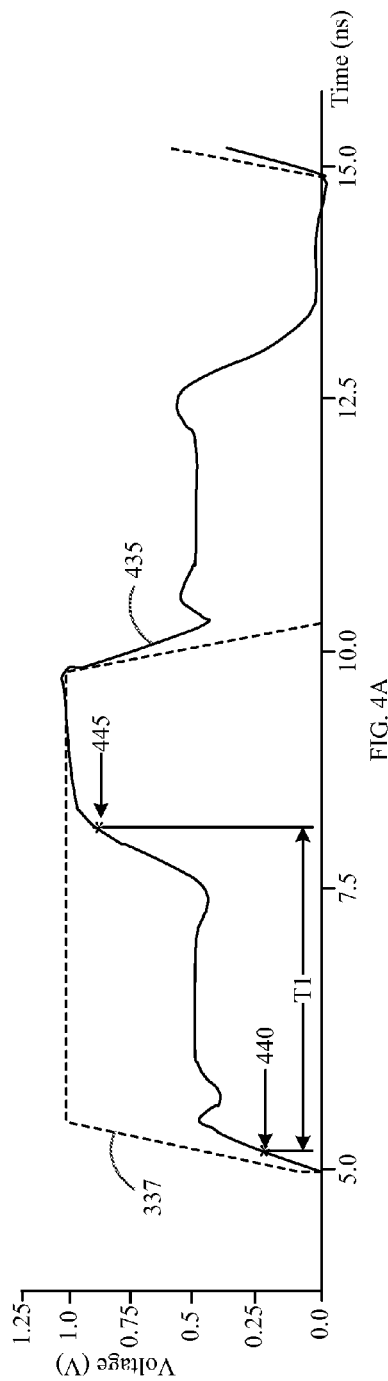
FIG. 4A is a diagram illustrating the clock signal and the reflected clock signal, in accordance with an embodiment of the present invention.
Figure 4B:
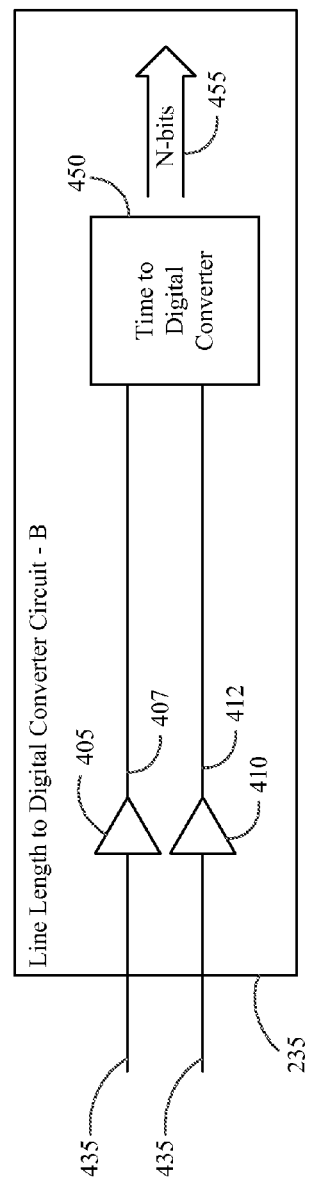
FIG. 4B is a diagram illustrating the line length to digital converters of the clock generator, in accordance with an embodiment of the present invention.
Figure 4C:
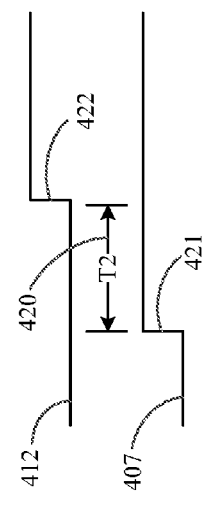
FIG. 4C is a diagram illustrating trigger voltages of the line length to digital converters of the clock generator, in accordance with an embodiment of the present invention.

In another exemplary embodiment shown with reference FIG. 4A, FIG. 4B and FIG. 4C, in order to automatically determine the length of the trace 140 between the clock generator 110 and the clock receiver B 120, a clock signal 337 is transmitted on the trace 140 between the clock generator 110 and clock receiver B 120. The clock signal 337 is reflected back by the clock receiver B 120 and the reflected signal 435 is received by a line length to digital converter circuit B 235 of the clock generator 110. The time required for the reflected signal 435 to be received at the line length to digital converter circuit B 235 is dependent upon the length of the conductive trace between the clock generator 110 and the clock receiver B 120. In general, the line length to digital converter circuit B 235 is configured to measure a time required for a reflected signal 435 on the clock generator output to reach a first voltage level, to measure a time required for the reflected signal 435 to reach a second voltage level and to calculate a difference between the time required for the reflected signal 435 to reach the first voltage level and the time required for the reflected signal to reach a second voltage level to determine a transit time for the trace 140 coupled to the clock generator output.

In one embodiment, the line length to digital converter circuit B 235 includes a first buffer 405 to receive the reflected signal 435 and a second buffer 410 to receive the reflected signal 435, wherein the threshold voltage of the first buffer 405 is lower than the threshold voltage of the second buffer 410. To measure the transit time for a trace coupled to a clock generator output, the first buffer 405 having a low threshold voltage, is used to measure the time required for a reflected signal 435 on a clock generator output to reach a first voltage level 440, wherein the first buffer 405 triggers when the clock output signal 435 reaches a first voltage level 440. The second buffer 410, having a high threshold voltage, is used to measure the time required for the reflected signal 435 on the same clock generator output to reach a second voltage level 445, wherein the second buffer 410 triggers when the clock output signal 435 reaches a second voltage level 445. The time difference (T1) between the time required for the reflected signal 435 to reach the first voltage level 440 and the time required for the reflected signal 435 to reach the second voltage level 445 is representative of the length of the conductive trace. In a specific embodiment, the first voltage level 440 may be equal to about 20% of a voltage of the transmitted clock signal and the second voltage level 445 may be equal to about 80% of a voltage of the transmitted clock signal.

As shown with reference to FIG. 4C, the relative length of the trace is then determined by measuring a time delay (T2) 420 between the rising edge 421 on the output 412 of the first buffer 405 and the rising edge 422 on the output 412 of the second buffer 410.

The line length to digital converter circuit B 235 may further include a time to digital converter 450 coupled to the outputs 407, 412 of the first buffer 405 and the second buffer 410 for converting the measured time delay to a digital representation of the trace length. The line length to digital converter circuit B 235 may be configured to detect the rising edge 421 at an output 407 of the first buffer 405 to measure the time required for the reflected signal 435 to reach the first voltage level 440 and to detect a rising edge 422 at an output 412 of the second buffer 410 to measure the time required for the reflected signal 435 to reach the second voltage level 445. The time to digital converter 450 is further configured to convert the transit time 420, which is equal to the difference between the time required for the reflected signal to reach the first voltage level and the time required for the reflected signal to reach the second voltage level, to a digital transit time for the trace coupled to the clock generator output.

In comparing FIG. 3A and FIG. 4A it can be seen that the time between the first voltage level 440 and the second voltage level 445 measured by line length to digital converter circuit B 235 of the clock receiver B 120 is greater that the time between the first voltage level 340 and the second voltage level 345 measured by the line length to digital converter circuit A 220 of clock receiver A 115. It follows that the length of the trace 140 between the clock generator 110 and clock receiver B 120 is greater than the length of the trace 130 between the clock generator 110 and clock receiver A 115.

It follows, that a similar process could be used to measure effective length of the trace 135 between the clock generator 110 and the clock receiver C 125.

Accordingly, each line length to digital converter circuit 220, 235, 250 is operable to monitor the voltage at the clock generator output to determine when the clock signal leading edge waveform is output (indicated by the voltage at the clock generator output reaching the first voltage level) and to determine when the reflection causes the voltage to increase at the clock generator output (indicated by the voltage at the clock generator output reaching the second voltage level). The time to digital converter may then provide the N-bit digital representation of the trace length to the control circuit 200. As previously described, the control circuit 200 then uses the digital representation of the trace lengths to determine a time delay to be added to each of the clock generator outputs to deskew a clock signal transmitted on each of the clock generator outputs. In this way all of the clock generator outputs will rise at the same time and the clock generator outputs have been deskewed.

Figure 5B:
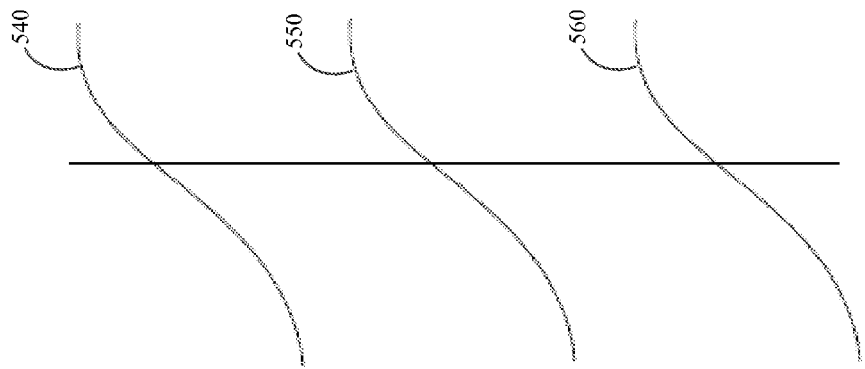
FIG. 5B is a diagram illustrating the deskewed clock signals from the clock generator, in accordance with an embodiment of the present invention.
Figure 5A:
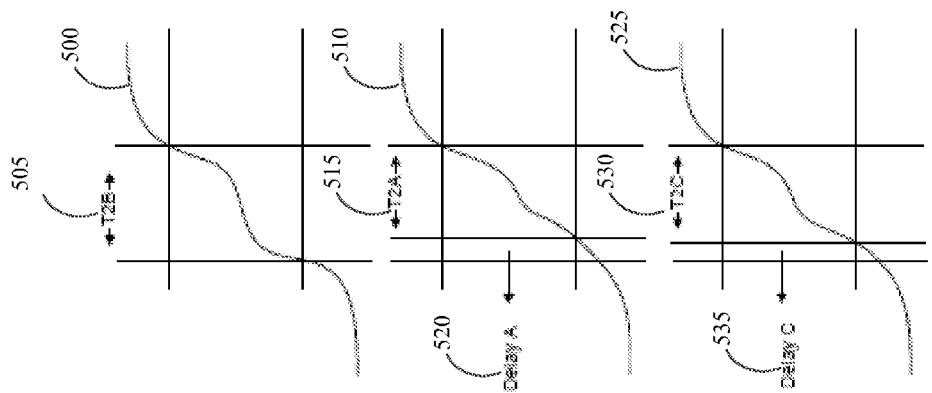
FIG. 5A is a diagram illustrating the skewed clock signals from the clock generator, in accordance with an embodiment of the present invention.

In operation of the present invention, with reference to FIG. 5A and FIG. 5B, the clock generator 110 measures the transmit time for each of the traces coupled to each of the clock generator outputs and adds a calculated time delay to each of the clock generator outputs to deskew a clock signal transmitted from each of the clock generator outputs. As shown in FIG. 5A, the clock generator 110 measures the transit time of a first trace (T2A) 515 for a waveform 510 transmitted on the first trace between a first clock generator output and a first clock receiver. The clock generator 110 additionally measures the transit time of a second trace (T2B) 505 for a waveform 500 transmitted on the second trace between a second clock generator output and a second clock receiver and the transit time of the third trace (T2C) 530 for a waveform 525 transmitted on the third trace between a third clock generator output and a third clock receiver. The clock generator 110 then compares a digital representation of the transit time of each of the traces 505, 515, 530 and determines that the transit time of second trace (T2B) 505 has the longest transit time. The clock generator 110 then calculates a delay for each of the shorter traces. In this embodiment, a time delay is calculated for the first trace (delay A) 520 and a time delay is calculated for the third trace (delay C) 535. After the appropriate time delays have been determined, the clock generator 110 adds the calculated time delay to a clock signal generated on each of the clock generator outputs to deskew the clock signal. As such, when the clock generator 110 transmits a simultaneous clock signal to the first clock receiver, the clock signal to the second clock receiver is sent without any additional time delay. When the simultaneous clock signal is transmitted to the first clock receiver, the transmission of the clock signal is delayed by a time equal to a first time delay (delay A) 520 and when the simultaneous clock signal is transmitted to the third clock receiver, the transmission of the clock signal is delayed by a time equal to a third time delay (delay C) 535. FIG. 5B illustrates the deskewed clock generator outputs for each of the three traces. As shown with reference to FIG. 5B, by adding the appropriate time delay to the clock generator outputs, the clock signal transmitted on the second trace 540, the first trace 550 and the third trace 560 all arrive at the corresponding clock receiver at the same time, thereby deskewing the clock generator outputs.

In a specific embodiment, the present invention may be implemented in a clock skew equalization circuit of the clock generator 110 and the clock skew equalization may perform the deskewing of the clock generator outputs as previously described.

Figure 6:
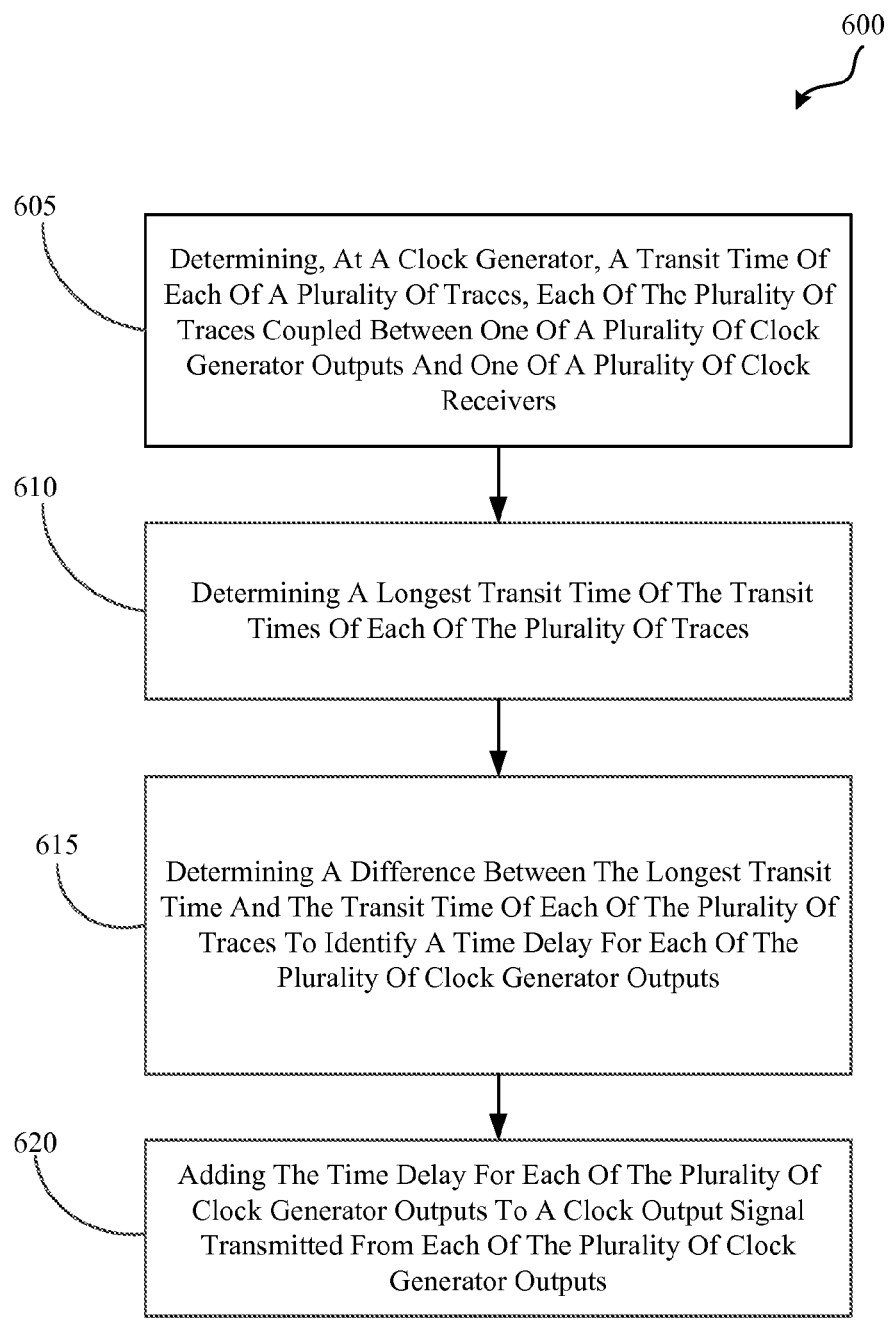
FIG. 6 is a flow diagram illustrating a method of deskewing the clock generator output signals, in accordance with an embodiment of the present invention.

With reference to FIG. 6, in accordance with the present invention, a method for deskewing output clock 600 signals includes, determining, at a clock generator, a transit time of each of a plurality of traces, each of the plurality of traces coupled between one of a plurality of clock generator outputs and one of a plurality of clock receivers 605. With reference to FIG. 4, the transit time of each of the plurality of traces may be determined by the line length to digital converters 220, 235, 250 of the clock generator 110. More particularly, in one embodiment, each line length to digital converter monitors a clock generator output to determine when the voltage level at the clock generator output reaches a first voltage level that corresponds to the voltage level of the rising edge of an output clock signal prior to a reflection of the output clock signal reaching the clock generator output and a second voltage level that corresponds to the voltage level of the rising edge of the output clock signal after the reflection of the output clock signal reaches the clock generator output so as to increase the voltage level at the clock generator output.

After the length of each of the traces has been determined, the method continues by determining a longest transit time of the transit times of each of the plurality of traces 610. In determining the longest transit time, the control circuit 200 of the clock generator 110 may receive the transits times of each of the traces from the line length to digital converters 220, 235, 250 and identify the trace with the longest transit time. The transit times may be determined by transmitting a signal on each of the plurality of clock generator outputs, measuring a time required for a reflected signal resulting from the signal transmitted on each of the plurality clock outputs to reach a first voltage level, measuring a time required for the reflected signal to reach a second voltage level and calculating a difference between the time required for the reflected signal to reach the first voltage level and the time required for the reflected signal to reach a second voltage level to determine a transit time for each of the plurality of traces.

After identifying the trace with the longest transit time, the method continues by determining a difference between the longest transit time and the transit time of each of the plurality of traces to identify a time delay for each of the plurality of clock generator outputs 615. In one embodiment, the control circuit 200 of the clock generator 110 is configured for identifying the time delay for each of the clock generator outputs. In one embodiment the time delay to be added to each clock generator output is identified by dividing each determined round-trip time difference by half to obtain a time delay for each clock generator output that reflects the one-way transit time to the respective clock receiver 115 or 135.

Following the determination of an appropriate time delay for each of the clock generator outputs, the method continues by adding the time delay for each of the plurality of clock generator outputs to a output clock signal transmitted from each of the plurality of clock generator outputs 620. In one embodiment, the control circuit 200 provides the appropriate calculated time delays to a digitally controlled delay element 205, 225, 240 coupled to each of the clock generator outputs. Digitally controlled delay elements 205, 225, 240 are configured to delay a clock signal transmitted at the clock generator output by the appropriate calculated time delay, thereby deskewing the clock generator outputs.

The invention describes a system and method by which the multiple outputs of a clock generator can be made to arrive at their destinations substantially simultaneously. The system and method of the present invention automatically detects the trace lengths at each output of a clock generator and adds an appropriate delay to each of the outputs to deskew the clock generator outputs, thereby eliminating the need for board level clock de-skewing by the system board designer.

Exemplary embodiments of the invention have been described using CMOS technology. As would be appreciated by a person of ordinary skill in the art, a particular transistor can be replaced by various kinds of transistors with appropriate inversions of signals, orientations and/or voltages, as is necessary for the particular technology, without departing from the scope of the present invention.

In one embodiment, the deskewing clock generator may be implemented in an integrated circuit as a single semiconductor die. Alternatively, the integrated circuit may include multiple semiconductor dies that are electrically coupled together such as, for example, a multi-chip module that is packaged in a single integrated circuit package.

In various embodiments, the system of the present invention may be implemented in a Field Programmable Gate Array (FPGA) or Application Specific Integrated Circuit (ASIC). As would be appreciated by one skilled in the art, various functions of circuit elements may also be implemented as processing steps in a software program. Such software may be employed in, for example, a digital signal processor, microcontroller or general-purpose computer.

For purposes of this description, it is understood that all circuit elements are powered from a voltage power domain and ground unless illustrated otherwise. Accordingly, all digital signals generally have voltages that range from approximately ground potential to that of the power domain.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A method for deskewing output clock signals, the method comprising:
   determining, at a clock generator, a transit time of each of a plurality of traces, each of the plurality of traces coupled between one of a plurality of clock generator outputs and one of a plurality of clock receivers;
   determining a longest transit time of the transit times of each of the plurality of traces;
   determining a difference between the longest transit time and the transit time of each of the plurality of traces to identify a time delay for each of the plurality of clock generator outputs; and
   adding the time delay for each of the plurality of clock generator outputs to a output clock signal transmitted from each of the plurality of clock generator outputs.

2. The method of claim 1, wherein the transit time of each of the plurality of traces is approximately equal to one half of a round-trip transit time of a signal transmitted on the trace between the clock generator output and the clock receiver.

3. The method of claim 1, wherein determining, at a clock generator, a transit time of each of a plurality of traces further comprises:
   transmitting a signal on each of the plurality of clock generator outputs;
   measuring a time required for a reflected signal resulting from the signal transmitted on each of the plurality clock generator outputs to reach a first voltage level;
   measuring a time required for the reflected signal to reach a second voltage level; and
   calculating a difference between the time required for the reflected signal to reach the first voltage level and the time required for the reflected signal to reach the second voltage level to determine a transit time for each of the plurality of traces.

4. The method of claim 3, wherein the first voltage level is lower than the second voltage level.

5. The method of claim 3, wherein the first voltage level is equal to about 20% of a voltage of the transmitted signal.

6. The method of claim 3, wherein the second voltage level is equal to about 80% of a voltage of the transmitted signal.

7. The method of claim 3, wherein measuring a time required for a reflected signal resulting from the signal transmitted on each of the plurality clock generator outputs to reach a first voltage level further comprises:
   receiving the reflected signal at an input of a first buffer, the first buffer having a voltage threshold substantially equal to the first voltage level; and
   detecting a rising edge at an output of the first buffer to measure the time required for the reflected signal to reach the first voltage level.

8. The method of claim 3, wherein measuring the time required for a reflected signal to reach a second voltage level further comprises:
   receiving the reflected signal at an input of a second buffer, the second buffer having a voltage threshold substantially equal to the second voltage level; and
   detecting a rising edge at an output of the second buffer to measure the time required for the reflected signal to reach the second voltage level.

9. The method of claim 1, wherein adding the time delay for each of the plurality of clock generator outputs to a output clock signal transmitted from each of the plurality of clock generator outputs, further comprises, not adding the time delay to an output clock signal transmitted from the clock output coupled to the trace having the longest transit time.

10. The method of claim 1, further comprising converting the transit time of each of the plurality of traces to a digital transit time for each of the plurality of traces prior to determining a longest transit time of the transit times of each of the plurality of traces.

11. A circuit for deskewing output signals of a clock generator, the circuit comprising:
    a plurality of line length to digital converter circuits, each of the line length to digital converter circuits coupled to one of a plurality of clock generator outputs of a clock generator and each of the line length to digital converter circuits configured to determine a transit time of a trace coupled between a clock generator output of the plurality of clock generator outputs and one of a plurality of clock receivers;
    a control circuit coupled to each of the plurality of line length to digital converter circuits, the control circuit configured to determine a longest transit time of the transit times determined by each of the line length to digital converter circuits and to determine a difference between the longest transit time and each determined transit time of a trace identify a time delay for each of the plurality of clock generator outputs; and
    a plurality of digitally controlled delay elements, each of the plurality of digitally controlled delay elements coupled to the control circuit and to one of the plurality of clock generator outputs and each of the digitally controlled delay elements configured to receive the time delay for the clock generator output that the digitally controlled delay element is coupled to from the control circuit and to add the received time delay for the clock generator output to an output clock signal transmitted from the clock generator output.

12. The circuit of claim 11, wherein the transit time of a traces is approximately equal to one half of a transit time of a signal transmitted on the trace between the clock generator output and the clock receiver.

13. The circuit of claim 11, wherein each of the plurality of line length to digital converter circuits are further configured to measure a time required for a reflected signal on the clock generator output to reach a first voltage level, measure a time required for the reflected signal to reach a second voltage level and calculate a difference between the time required for the reflected signal to reach the first voltage level and the time required for the reflected signal to reach a second voltage level to determine a transit time for the trace coupled to the clock generator output.

14. The circuit of claim 13, wherein the first voltage level is equal to about 20% of a voltage of the transmitted signal.

15. The circuit of claim 13, wherein the second voltage is equal to about 80% of a voltage of the transmitted signal.

16. The circuit of claim 13, wherein each of the plurality of line length to digital converter circuits further comprises:
    a first buffer configured to receive the reflected signal, wherein the first buffer comprises a voltage threshold substantially equal to the first voltage level; and
    a second buffer configured to receive the reflected signal, wherein the second buffer comprises a voltage threshold substantially equal to the second voltage level.

17. The circuit of claim 16, wherein each of the plurality of line length to digital converter circuits further comprises a time to digital converter circuit configured to detect a rising edge at an output of the first buffer to measure the time required for the reflected signal to reach the first voltage level and to detect a rising edge at an output of the second buffer to measure the time required for the reflected signal to reach the second voltage level.

18. The circuit of claim 17, wherein the time to digital converter is further configured to convert a transit time equal to the difference between the time required for the reflected signal to reach the first voltage level and the time required for the reflected signal to reach the second voltage level to a digital transit time for the trace coupled to the clock generator output.

19. The circuit of claim 11, wherein the control circuit is further configured to not add a time delay to a clock signal transmitted from the clock generator output coupled to the trace having the longest transit time.

20. An integrated circuit clock generator having deskewed output signals, the clock generator comprising:
  a clock skew equalization circuit comprising;
    a plurality of line length to digital converter circuits, each of the line length to digital converter circuits coupled to one of a plurality of clock generator outputs of a clock generator and each of the line length to digital converter circuits configured to determine a transit time of a trace coupled between a clock generator output of the plurality of clock generator outputs and one of a plurality of clock receivers;
  a control circuit coupled to each of the plurality of line length to digital converter circuits, the control circuit configured to determine a longest transit time of the determined transit times and to determine a difference between the longest transit time and each determined transit time of a trace to identify a time delay for each of the plurality of clock generator outputs; and
  a plurality of digitally controlled delay elements, each of the plurality of digitally controlled delay elements coupled to the control circuit and to one of the plurality of clock generator outputs and each of the digitally controlled delay elements configured to receive the time delay for the clock generator output that the digitally controlled delay element is coupled to and to add the received time delay for the clock generator output to an output clock signal transmitted from the clock generator output.

* * * * *